Figure 1:
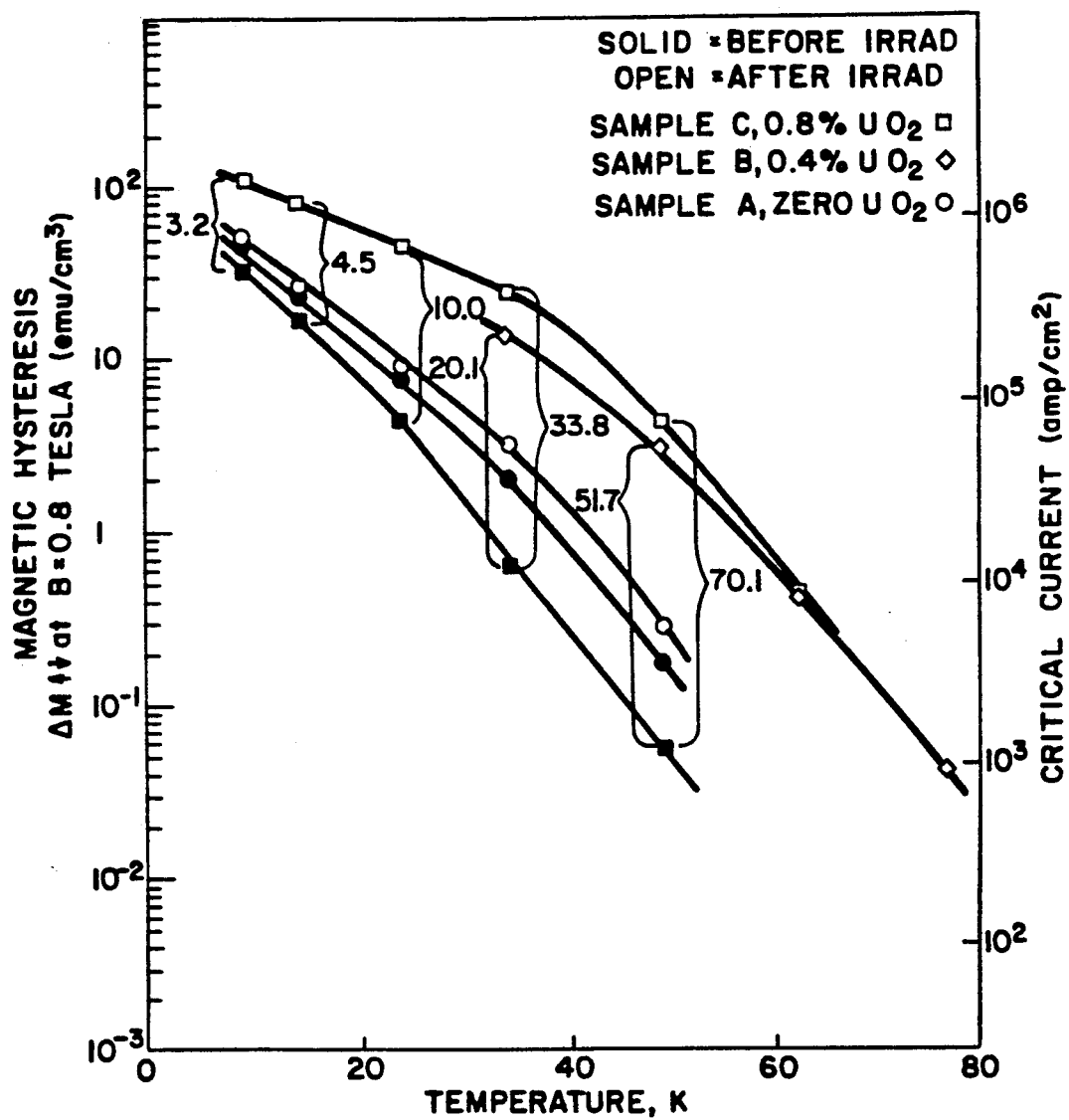

United States Patent [19]

Fleischer et al.

[11] Patent Number: 5,087,606

[45] Date of Patent: Feb. 11, 1992

[54] BISMUTH-CONTAINING SUPERCONDUCTORS CONTAINING RADIOACTIVE DOPANTS

[75] Inventors: Robert L. Fleischer; Ronald H. Arendt, both of Schenectady, N.Y.

[73] Assignee: General Electric Company, Schenectady, N.Y.

[21] Appl. No.: 529,814

[22] Filed: May 29, 1990

[51] Int. Cl.$^5$ .............................. H01B 12/00
[52] U.S. Cl. ............................ 505/1; 505/782; 505/785; 252/517; 423/251; 423/260
[58] Field of Search ................ 505/1, 782, 785; 252/517; 423/251, 260

[56] References Cited

U.S. PATENT DOCUMENTS 4,996,192 2/1991 Fleischer .......................... 252/517

OTHER PUBLICATIONS

Fleischer et al., "Increased Flux Pinning Upon Thermal-Neutron Irradiation of Uranium Doped YBACu$_3$O$_7$", *G. E. Research Report 89CRD047*, Apr. 1989.
Bean et al., "Effect of Thermal-Neutron Irradiation on the Superconducting Properties of Nb$_3$Al and V$_3$Si Doped . . .", *Jrnl. of App. Phys.*, 37(6) May 1966.

Primary Examiner—Paul Lieberman
Assistant Examiner—Bradley A. Swope
Attorney, Agent, or Firm—James Magee, Jr.; James C. Davis, Jr.

[57] ABSTRACT

A process for producing a sinterable doped superconductive powder which contains a sufficient amount of superconductive compound which is at least coated with sufficient uranium-235 and/or plutonium-239 dopant atoms to enable the sinterable powder to be formed into a sintered superconductive body which can be irradiated with thermal neutrons to produce from about $0.25 \times 10^{14}$ to about $5 \times 10^{14}$ fission events per cubic centimeter of the resulting irradiated superconductive body, said superconductive compound being selected from the group consisting of $Bi_2CaSr_2Cu_2O_8 \pm x$ where x ranges from zero to 0.5, $Bi_{2-y}Pb_yCa_2Sr_2Cu_3O_{10 \pm z}$ where y ranges from 0.1 to 0.5 and z ranges from zero to less than 1, and mixtures thereof.

4 Claims, 4 Drawing Sheets

BISMUTH-CONTAINING SUPERCONDUCTORS CONTAINING RADIOACTIVE DOPANTS

This is related to the following copending applications and patents which are assigned to the assignee hereof and incorporated herein by reference:

U.S. Ser. No. 07/489,309, filed Mar. 5, 1990, for R. H. Arendt and M. F. Garbauskas, for "SYNTHESIS OF Bi-Pb-Ca-Sr-Cu-O ORIENTED POLYCRYSTAL SUPERCONDUCTOR";

U.S. Ser. No. 07/478,393, filed Feb. 12, 1990, for R. H. Arendt and M. F. Garbauskas, for "SYNTHESIS OF Bi-Pb-Ca-Sr-Cu-O SUPERCONDUCTIVE MATERIAL";

U.S. Ser. No. 07/399,197, filed Aug. 28, 1989, for R. H. Arendt, for "SYNTHESIS OF Bi-Ca-Sr-Cu-O SUPERCONDUCTIVE MATERIAL";

U.S. Ser. No. 07/380,966, filed July 17, 1989, for R. L. Fleischer, for "Y-Ba-Cu-O SUPERCONDUCTOR"; NOW U.S. Pat. No. 4,996,192.

U.S. Pat. No. 3,310,395 to Swartz et al. for "SUPERCONDUCTORS CONTAINING A FISSIONABLE METAL OR BORON IMPURITY"; and U.S. Pat. No. 3,346,425 to R. L. Fleischer for "SUPERCONDUCTORS".

In one aspect, this invention discloses the production of a Bi-containing powder which has been doped with fissionable material. In another aspect, this invention discloses the use of such a doped Bi-containing powder to form a polycrystalline body which can be irradiated to improve its superconductive properties.

The discovery of ceramic superconductors with high critical temperatures has greatly improved the prospect of widespread practical application of superconductivity. Unfortunately, there are still major hurdles to be overcome before such prospects can be realized. In particular the critical-current densities of sintered, polycrystalline high-temperature superconductors are much too low, especially in useful magnetic fields at higher temperatures. It appears that the intergranular superconductive coupling in polycrystalline materials is very weak and that flux pinning within grains is low, leading to very rapid flux creep and low critical-current densities even in single grains.

The pinning of flux within bulk type-II superconductors is caused by imperfections in the lattice. For traditional practical low-temperature superconductors such as Nb-Ti or $Nb_3Sn$, such imperfections or pinning centers include dislocations, grain boundaries, and non-superconducting inclusions or voids. For the newer, high-temperature ceramic superconductors it is not clear what the naturally occurring weak pinning centers are. The traditional methods of introducing lattice defects, such as cold work and grain-boundary control through heat treatment, appear not to be useful for the ceramic materials; they are brittle and their grain boundaries are so weak that they increase the movement of flux instead of decreasing it. Another approach that has been effective in the older, low-temperature superconductors is the introduction of pinning centers by radiation damage.

In one embodiment, this invention discloses that fission-fragment damage is introduced by doping Bi-containing superconductive powder with natural uranium, forming a sintered polycrystalline body thereof, and exposing the polycrystalline body to thermal neutrons, inducing fission of the uranium-235 component. The special opportunity that is envisioned in inducing fission is that the fraction of dispersed, isolated point defects is minimized relative to clumps of displaced atoms and disordered material, which are expected to be more effective pinning centers. Thus, greater flux pinning should be created before the total damage begins to degrade the critical temperature seriously.

Those skilled in the art will gain a further and better understanding of the present invention from the detailed description set forth below, considered in conjunction with the figures accompanying and forming a part of the specification in which:

FIG. 1 shows the magnetic hysteresis indicated by $\Delta M$ at 0.8 Tesla (left-hand scale) versus temperature for three (unirradiated and irradiated) samples of powder, i.e. one sample (Sample A) of $Bi_{1.7}Pb_{0.3}Ca_2Sr_2Cu_3O_{10\pm z}$ powder, a second sample (Sample B) of $Bi_{1.7}Pb_{0.3}Ca_2Sr_2Cu_3O_{10\pm z}$ powder doped with an equivalent of 0.4% by weight of $UO_2$, and a third sample (Sample C) of $Bi_{1.7}Pb_{0.3}Ca_2Sr_2Cu_3O_{10\pm z}$ powder doped with an equivalent of 0.8% by weight of $UO_2$. The right-hand scale shows the intragranular critical-current density derived from magnetic hysteresis and grain size using the critical-state model set forth herein assuming that each of the powder samples has its theoretical density.

Figure 2:
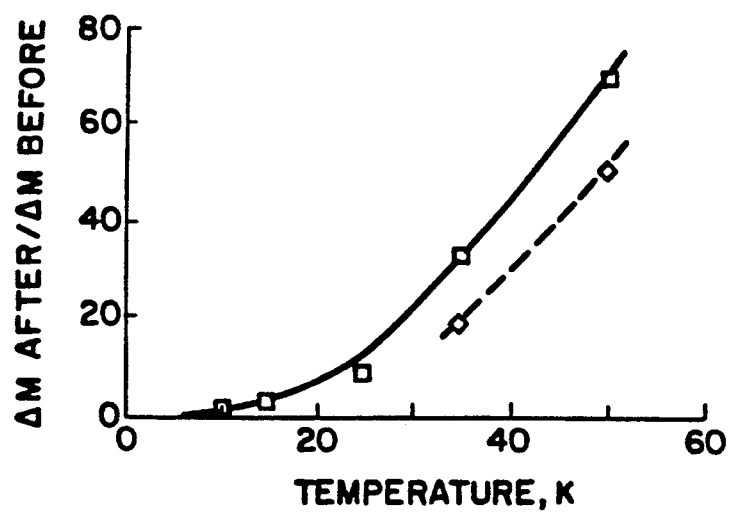

FIG. 2 shows the ratio of magnetic hysteresis of FIG. 1 after and before irradiation for Samples C and B versus temperature. FIGS. 1 and 2 show that the critical currents are raised by the fission-fragment irradiation, more at higher doses, and more at higher temperature.

Figure 3:
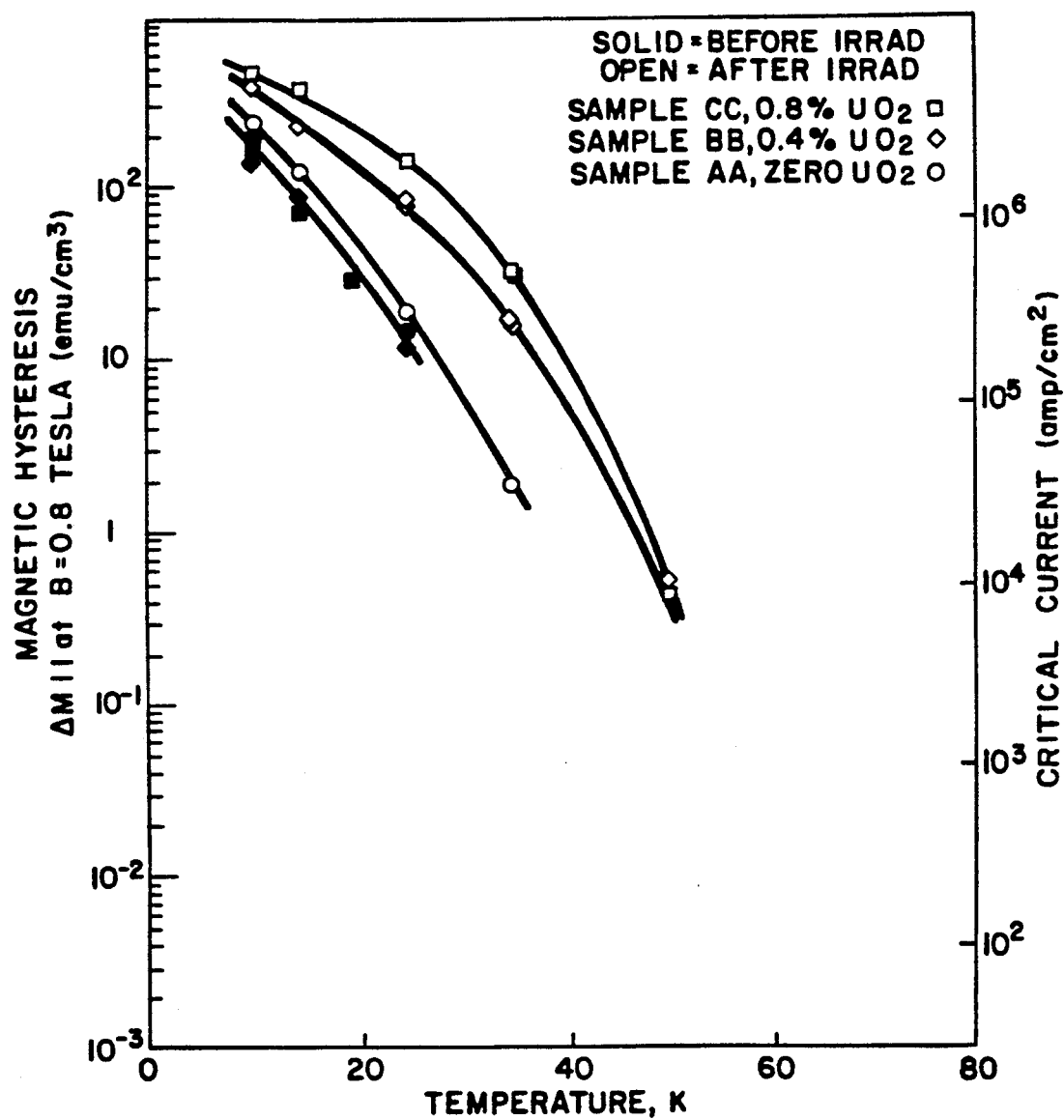

FIG. 3 shows the magnetic hysteresis at 0.8 Tesla (left-hand scale) versus temperature for three (unirradiated and irradiated) samples of powder, i.e. one sample (Sample AA) of $Bi_2CaSr_2Cu_2O_{8\pm x}$ powder, a second sample (Sample BB) of $Bi_2CaSr_2Cu_2O_{8-x}$ powder doped with an equivalent of 0.4% by weight of $UO_2$, and a third sample (Sample CC) of $Bi_2CaSr_2Cu_2O_{8+x}$ powder doped with an equivalent of 0.8% by weight of $UO_2$. The right-hand scale shows the intragranular critical-current density derived from magnetic hysteresis and grain size using the critical-state model set forth herein assuming that the powder samples have their theoretical density.

Figure 4:
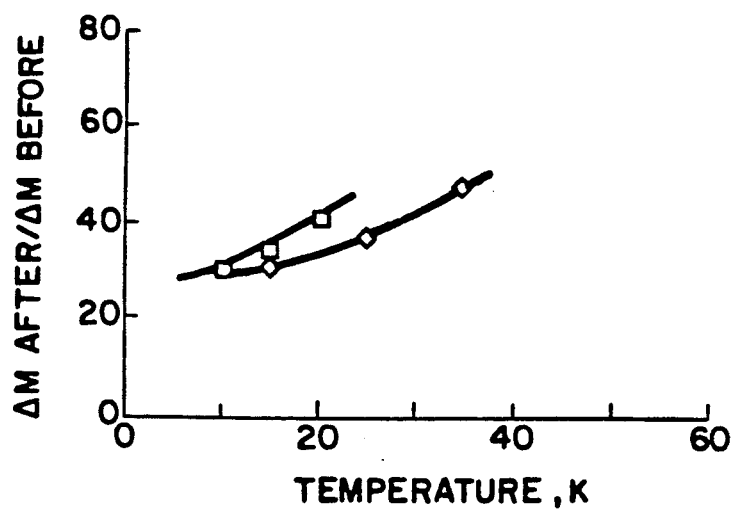

FIG. 4 shows the ratio of magnetic hysteresis of FIG. 3 after and before irradiation for Samples CC and BB versus temperature. FIGS. 3 and 4 show the same trends as were present for the $Bi_{1.7}Pb_{0.3}Ca_2Sr_2Cu_3O_{10\pm z}$-based material.

Briefly stated, the present process for producing a sinterable polycrystalline doped superconductive powder comprises providing a matrix powder selected from the group consisting of superconductive oxide, reactant oxides and/or precursor therefor and mixtures thereof, wherein the oxide composition of said matrix powder ranges from substantially stoichiometric to in excess of stoichiometric for producing the superconductive oxide compound selected from the group consisting of $Bi_2CaSr_2Cu_2O_{8\pm x}$ where x ranges from zero to 0.5, $Bi_{2-y}Pb_yCa_2Sr_2Cu_3O_{10\pm z}$ where y ranges from 0.1 to 0.5 and z ranges from zero to less than 1, and mixtures thereof, providing dopant atoms by providing an oxide additive or precursor therefor selected from the group consisting of natural uranium dioxide or an oxide containing dopant atoms equivalent to said natural uranium dioxide, uranium-235 dioxide or an oxide containing dopant atoms equivalent to said uranium-235 dioxide, plutonium-239 dioxide or an oxide containing dopant atoms equivalent to said plutonium-239 dioxide and mixtures thereof, all of the uranium component of said additive and all of the plutonium-239 component of said additive providing dopant atoms, said natural uranium dioxide or oxide containing equivalent dopant atoms providing dopant atoms comprised of natural uranium which includes the uranium-235 isotope, forming a reaction mixture of said matrix powder and said additive or precursor therefor, firing said reaction mixture in an oxidizing atmosphere at a reaction temperature ranging from about 820° C. to below the temperature at which sufficient liquid forms to prevent production of a reaction product wherein at least 70% by weight of said reaction product is comprised of said superconductive oxide compound and to at least coat said dopant atoms on said superconductive compound, said precursors decomposing at or below said reaction temperature producing said reactant oxide or oxide additive, cooling said reaction product in an oxidizing atmosphere producing solid reaction product and comminuting said solid reaction product to produce said sinterable doped powder ranging to a maximum particle size in its longest dimension of 40 microns, at least 70% by weight of said sinterable powder being comprised of particles of said superconductive compound at least coated with sufficient uranium-235 and/or plutonium-239 dopant atoms to make said sinterable powder useful for producing a superconductive sintered body which can be irradiated with thermal neutrons to produce from about $0.25 \times 10^{14}$ to about $5.0 \times 10^{14}$ fission events per cubic centimeter of the irradiated superconductive body.

In carrying out the present process, a matrix powder is provided selected from the group consisting of superconductive oxide, reactant oxides and/or precursor therefor and mixtures thereof. The oxide composition of the matrix powder ranges from substantially stoichiometric to in excess of stoichiometric with respect to the particular superconductive oxide compound to be produced. The particular composition of the matrix powder depends largely on the composition of the superconductive compound to be produced, and whether it is advantageous for a particular application to provide an excess amount of any of the reactant oxides determined empirically, to increase production of the particular compound or improve any of its superconductive properties.

In one embodiment, the matrix powder is comprised of the superconductive compound $Bi_2CaSr_2Cu_2O_{8\pm x}$ where x ranges from zero to 0.5, and preferably x is zero. Superconductive $Bi_2CaSr_2Cu_2O_{8\pm x}$ is also referred to herein as (2122).

In another embodiment, the matrix powder is comprised of the superconductive compound $Bi_{2-y}Pb_yCa_2Sr_2Cu_3O_{10\pm z}$ where y ranges from 0.1 to 0.5, preferably from 0.25 to 0.35, and most preferably it is 3, and z ranges from zero to less than 1. This superconductive compound also is referred to herein as (2223).

In yet another embodiment, the matrix powder is comprised of reactant oxides and/or precursors therefor.

The conventional preparation of these superconductive compounds can be used herein, and it is either the solid-state reaction of an intimate mixture of the particulate oxides, or compounds which yield them on heating, or the co-precipitation of the cations in intimate mixture as some salt that yields the oxides on subsequent heating to facilitate compound formation.

The precursor for a reactant oxide generally is inorganic and should thermally decompose completely preferably below reaction temperature to form the oxide and by-product gas or gases leaving no contaminants in the reaction product. Generally, the precursor is used in an amount sufficient to produce the respective oxide in the desired amount. Preferably, the carbonate is used as the source of calcium oxide or strontium oxide.

In a preferred embodiment, the matrix powder is comprised only of oxides. Preferably, to carry out such embodiment, a mixture of all precursors for reactant oxides is pre-fired in air at about atmospheric pressure at a temperature sufficient to thermally decompose the precursors, but preferably below the temperature at which significant liquid forms, and the resulting product is cooled in air to produce an oxide solid reacted product which generally is friable and can be comminuted in a conventional manner without introducing significant impurities. The oxide reacted product can then be used in providing the all-oxide matrix powder.

In one embodiment, an oxide reacted product is used to provide calcium oxide.

In another embodiment, the matrix powder is formulated to provide calcium oxide and/or copper in an amount ranging from 0.1 mole to 1.75 moles in excess of stoichiometric.

(2122) powder also can be prepared according to U.S. Ser. No. 07/399,197 by using a molten alkali chloride solvent reaction medium in which (2122) is precipitated and, after solidification of the reacted mass, (2122) is recovered by dissolving the chloride with water.

In one embodiment, with respect to providing or producing (2223), the matrix powder can be produced as set forth in U.S. Ser. No. 07/478,393 which discloses a process for producing solid superconductive material containing superconductive $Bi_{2-y}Pb_yCa_2Sr_2Cu_3O_{10\pm z}$ composition in an amount of at least 90% by weight of the material which comprises providing a particulate mixture of reactants comprised of $Bi_2CaSr_2Cu_2O_{8\pm x}$ where x ranges from 0 to 0.5, $Ca_2CuO_3$, cupric oxide, and lead oxide, said mixture of reactants being formulated to produce said superconductive composition and to provide an excess amount of said $Ca_2CuO_3$ and cupric oxide sufficient to drive the reaction to produce said superconductive composition in said superconductive material, said $Ca_2CuO_3$ and cupric oxide in said mixture being present in substantially mole equivalents to each other, heating said mixture in an oxidizing atmosphere at a reaction temperature ranging from 820° C. to 860° C. to produce a reaction product wherein said superconductive composition comprises at least 90% by weight of said product, said reaction temperature being below the temperature at which sufficient liquid forms to prevent production of said reaction product, cooling said reaction product in an oxidizing atmosphere producing said solid superconductive material, and comminuting said superconductive material to produce superconductive powder.

U.S. Ser. No. 07/478,393 also discloses that an oxide product comprised of a mixture of $Ca_2CuO_3$ and CuO is used therein to form the mixture of reactants; that to produce this oxide product, a particulate mixture of calcium carbonate and copper oxide initially is formed; that the mixture is formulated to produce substantially mole equivalents of calcium oxide and cupric oxide; that the mixture is fired in air at a temperature at least sufficient to decompose the carbonate but not so high as to form a significant amount of liquid; that firing temperature ranges from greater than about 850° C. to less than about 950° C.; and that firing is carried out at least until no significant amount of the carbonate remains. The oxide product is cooled in air, preferably to room temperature. The reaction is as follows:

$$CaO + CuO \rightarrow 1/2 Ca_2CuO_3 + 1/2 CuO = \text{``CaCuO}_2\text{''}$$

The oxide product is friable, and preferably, before it is mixed with the other reactants, it is lightly dry ground in a conventional manner. Generally, from 1.1 to 1.75 moles of total "CaCuO$_2$" is used per mole of (2122) in the mixture of reactants.

In the present process, there is no loss, or no significant loss, of dopant atoms prior to irradiation of the superconductive body. Therefore, the number of dopant atoms in the mixture comprised of the matrix powder and additive is the same as, or not significantly different from, the number of dopant atoms in the resulting sinterable powder, or in the resulting sintered body, prior to irradiation.

The present additive powder is an oxide, or precursor therefor, selected from the group consisting of natural uranium dioxide (UO$_2$) or an oxide containing equivalent dopant atoms, uranium-235 dioxide ($^{235}$UO$_2$) or an oxide containing equivalent dopant atoms, plutonium-239 dioxide ($^{239}$PuO$_2$) or an oxide containing equivalent dopant atoms, and mixtures thereof. The particular amount of additive is determined empirically. The additive should be used at least in an amount which provides sufficient uranium-235 and/or plutonium-239 dopant atoms to produce a sinterable powder which can be formed into a sintered body which can be irradiated with thermal neutrons to produce from about $0.25 \times 10^{14}$ to about $5 \times 10^{14}$ fission events per cubic centimeter of the resulting irradiated superconductive body.

Generally, the precursor for the oxide additive is inorganic. It should thermally decompose completely preferably below reaction temperature, to produce an oxide with dopant atoms equivalent to that of the dioxide and by-product gas or gases leaving no contaminants in the reacted mass. The precursor should be used in an amount sufficient to produce an oxide with the desired number of dopant atoms.

Preferably, the precursor for the oxide additive is the nitrate. Preferably, the nitrate is dissolved in an organic solvent, for example, methanol, and the solution is admixed with the matrix powder and dried to leave a coating of the precursor on the powder.

Natural uranium dioxide powder, which is derived from uranium ore, provides dopant atoms comprised of natural uranium which includes three natural radioactive isotopes. These are (% by weight of total natural uranium atoms) U-234 (0.0055%), U-235 (0.719%) and U-238 (balance). Uranium-235 ($^{235}$U) is a readily fissionable isotope, and it is this isotope of uranium which is caused to undergo fission herein.

Generally, natural uranium dioxide powder is used in an amount ranging from about 0.04% to about 0.8% by weight of the mixture comprised of the matrix powder and additive. Generally, it, or an oxide containing equivalent dopant atoms, is used in an amount which provides dopant atoms, i.e. its entire uranium component including isotopes thereof, ranging from about 150 to about 2300 atomic parts, i.e. dopant atoms, per million atomic parts of the total amount of the mixture of matrix powder and additive.

Uranium-235 dioxide is preferred since it provides only U-235 dopant atoms thereby providing a larger effect, i.e. more fission events, with lesser neutron irradiation. Generally, uranium-235 dioxide is used in an amount ranging from about 3 parts per million to about 8000 parts per million, preferably between 6 and 4000 parts per million, by weight of the mixture of matrix powder and additive. Generally, the $^{235}$UO$_2$ powder, or an oxide containing equivalent dopant atoms, is used in an amount which provides from about 0.8 to about 2000 atomic $^{235}$U parts per million atomic parts of the mixture of matrix powder and additive.

Generally, $^{239}$PuO$_2$ ranges from about 2 parts per million to about 0.6%, preferably about between about 5 and 2500 parts per million, by weight of the mixture of matrix powder and additive. Generally, the $^{239}$PuO$_2$ powder, or an oxide which contains equivalent dopant atoms, provides from about 0.6 to about 1500 atomic $^{239}$Pu parts per million atomic parts of the mixture of matrix powder and additive.

In one embodiment, the additive is comprised of a mixture formed by adding $^{235}$UO$_2$ to natural uranium dioxide, i.e. enriched uranium dioxide, wherein $^{235}$UO$_2$ comprises from about 1% to about 93% by weight of the additive, or wherein the $^{235}$U atoms comprise from about 1% to about 93% by weight of the dopant atoms.

The components of the reaction mixture comprised of matrix powder and oxide additive or precursor therefor should be of a size which allows the reaction product to be produced. Generally, these powders range from submicron up to about 100 microns, frequently from submicron to less than 50 microns. The powders should be free of large, hard aggregates, i.e. significantly above 100 microns in size, which might survive the mixing process and prevent sufficient reactant contact for satisfactory reaction rates.

In the present process, the components of the matrix powder as well as the reaction mixture can be admixed by a number of conventional techniques to produce a particulate mixture which is sufficiently uniform and is of a sufficiently fine size to carry out the reaction to produce the desired reaction product. Preferably, the components of the matrix powder as well as the reaction mixture are admixed to produce as intimate a mixture as possible without significant contamination to insure good contact. Preferably, in the reaction mixture comprised of matrix powder and oxide additive or precursor therefor, any (2122) or (2223) powder has an average particle size ranging in its longest dimension to less than 10 microns, or preferably it is less than 2 microns, and all other reactants or precursors therefor have an average particle size which is submicron.

The reaction mixture of matrix powder and additive is reacted in an oxidizing atmosphere to produce the present reaction product. The particular reaction temperature is determined empirically and depends largely on the composition of the reactants, i.e. the composition being fired. Generally, reaction temperature ranges from about 820° C. to 860° C. for (2223) material, and from about 820° C. to 870° C. for (2122) material. Frequently, reaction temperature ranges from 820° C. to 860° C. The reaction temperature should be below the temperature at which a sufficient amount of liquid forms that segregates the reactants sufficiently to prevent production of the desired superconductive compound.

Reaction time is determined empirically, i.e. it should be sufficient to enable the production of the reaction product containing the desired superconductive oxide in an amount generally of at least 70%, or at least 85%, and preferably at least 90%, by weight of the product. Also, reaction time should be sufficient to at least adhere sufficient uranium-235 and/or plutonium-239 dopant atoms to the superconductive compound forming an adherent coating of dopant atoms thereon to make the resulting sinterable powder useful for producing a superconductive sintered body which can be irradiated with thermal neutrons to produce from about $0.25 \times 10^{14}$ to about $5.0 \times 10^{14}$ fission events per cubic centimeter of the irradiated superconductive body. Preferably, firing at reaction temperature is carried out to substitute a portion, preferably the maximum soluble portion, determined empirically, of the dopant atoms in the superconductive compound.

The reaction product is cooled in an oxidizing atmosphere, generally to about room temperature, to produce the desired solid superconductive reaction product. Generally, the oxidizing atmosphere, i.e., the atmosphere for carrying out the reaction as well as for cooling the reaction product, is comprised of at least about 1% by volume of oxygen and the remainder of the atmosphere is a gas which has no significant deleterious effect on the reaction product such as nitrogen or a noble gas such as argon or helium. Preferably, the oxidizing atmosphere is air. Generally, the oxidizing atmosphere is at about atmospheric pressure. The cooling rate of the reaction product is determined empirically and can vary, i.e. it can be fast or slow cooled. In one embodiment, it is furnace cooled to room temperature.

The reaction product is comminuted to produce the present superconductive sinterable powder of desired size. The particular size, or size distribution, of the powder is determined empirically. However, to enable the production of the irradiated sintered body having the required fission events per cubic centimeter herein, the sinterable powder ranges in particle size to a maximum of 40 microns, preferably to a maximum of 20 microns, in its longest dimension. Generally, the present superconductive sinterable powder has an average size in its longest dimension ranging up to about 10 microns and frequently it is less than about 2 microns.

Conventional comminuting techniques can be used which have no significant deleterious effect on the resulting powder, i.e. which do not introduce undesirable impurities or a significant amount of contaminants. In one embodiment, the reaction product is dry milled, i.e. preferably with zirconia media, in a dry atmosphere such as nitrogen.

The sinterable powder is polycrystalline and is comprised of an oxide or oxides. It contains at least a detectable amount of dopant atoms, i.e. an amount detectable by a mass spectrometer.

Conventional ceramic processing techniques can be used to form the sinterable powder into a polycrystalline superconductive sintered body. Specifically, the sinterable powder may be pressed into green bodies of desired size and shape and sintered in a known manner at temperatures determined empirically, preferably ranging from 820° C. to 850° C., generally ranging from about 820° C. to 860° C. for (2223) material and from 820° C. to 870° C. for (2122) material, in air at about atmospheric pressure to produce a sintered body of desired density, preferably having a total porosity no greater than 20% by volume, and cooled in air at a rate determined empirically, preferably rapidly, at about atmospheric pressure preferably to room temperature.

By room temperature herein it is meant a temperature ranging from 15° C. to 30° C.

Superconductivity of the sintered body, before and after irradiation, can be determined by conventional techniques. For example, it can be demonstrated by magnetic flux exclusion, the Meissner effect.

The superconductive body is irradiated with thermal neutrons to cause a sufficient number of uranium-235 dopant atoms, or plutonium-239 dopant atoms, or a mixture thereof to undergo fission to produce from about $0.25 \times 10^{14}$ to about $5 \times 10^{14}$ fission events per cubic centimeter of the body. By fission events, it is meant herein the energetic process of division of a fissionable nucleus that has absorbed a neutron into primarily two heavy nuclei, each comprising substantially half of the mass of the original fissionable nucleus, and the motion of these fission fragments until they come to rest. The fission products are known and can be identified and counted by a mass spectrometer. It is the production and motion of these fission fragments which causes radiation damage in the grains of the body resulting in a significant improvement in certain superconductive properties. Generally, the production of less than about $0.25 \times 10^{14}$ fission events per cubic centimeter of the body may not have a significant effect on its properties. The production of more than about $5 \times 10^{14}$ fission events per cubic centimeter of the body may have a significant deleterious effect thereon, such as, for example, lowering its zero resistance transition, i.e. critical, temperature substantially. Preferably, irradiation is carried out to produce from about $0.6 \times 10^{14}$ to about $2 \times 10^{14}$ fission events per cubic centimeter of the body.

The irradiation of the superconductive body with thermal neutrons can be carried out in a known manner. The radiation dose should be sufficient to produce the present fission events in the body and should not have a significantly deleterious effect thereon. The particular radiation dose is calculated from the number of $^{235}U$ and/or $^{239}Pu$ dopant atoms in the body, the fission cross-sections of the $^{235}U$ and/or $^{239}Pu$, and the particular superconductive properties desired. Generally, the minimum radiation dose ranges from about $5 \times 10^{14}$ to about $1 \times 10^{17}$ thermal neutrons per square centimeter of the body. Generally, a radiation dose of at least about $5 \times 10^{14}$ thermal neutrons per square centimeter of the body is required when the dopant atoms are comprised of $^{235}U$ or $^{239}Pu$. Generally, a radiation dose of at least about $1 \times 10^{17}$ thermal neutrons per square centimeter of the body is required when the dopant atoms are comprised of natural uranium.

Generally, irradiation is carried out as close to room temperature as the neutron source that is used permits. Irradiation is carried out in an atmosphere which can be at about atmospheric pressure or a partial vacuum which has no significant deleterious effect on the superconductive body which can be determined empirically. Preferably, irradiation is carried out in an atmosphere of oxygen or an oxygen-enriched atmosphere at about atmospheric pressure or a partial vacuum if the sample has a tendency to lose oxygen.

Generally, the irradiation lowers the zero resistance transition temperature of the superconductive body less than 30%, preferably less than 20%, and more preferably it does not change it, or does not change it significantly.

Preferably, the irradiation produces a superconductive polycrystalline body having a significantly higher magnetic hysteresis at a temperature at which it is superconductive above 5K.

By a temperature at which the body is superconductive, it is meant herein a temperature at which it has no electrical resistance.

Irradiation of the doped sintered body may result in a body comprised of grains wherein the individual grains have a significantly higher critical current density at a temperature above 5K at which the body is superconductive.

Since magnetic hysteresis is a measure of critical current density, it can be inferred that an increase in magnetic hysteresis is accompanied with an increase in critical current density.

The irradiated superconductive body would be useful as a conductor for magnets, motors, generators, and power transmission lines.

The invention is further illustrated by the following examples wherein the procedure was as follows unless otherwise stated.

The dispersant used was an organic dispersant sold under the trademark Triton X-100.

All firing or heating as well as cooling was carried out in air at about atmospheric pressure.

Firing was carried out in a silicon carbide resistance furnace.

EXAMPLE 1

In this example, three samples of powder were produced, an undoped control sample comprised of $Bi_{1.7}Pb_{0.3}Ca_2Sr_2Cu_3O_{10\pm z}$ (Sample A), and two doped samples of $Bi_{1.7}Pb_{0.3}Ca_2Sr_2Cu_3O_{10\pm z}$ (Samples B and C).

To produce the samples, the matrix powder was formulated to have an oxide composition corresponding to $Bi_{1.7}Pb_{0.3}Ca_{2.75}Sr_2Cu_{3.75}O_{10\pm z}$.

Specifically, a particulate mixture comprised of 158.41 grams of calcium carbonate, 169.93 grams of strontium carbonate and 171.66 grams of cupric oxide was wet milled in a two liter polyethylene jar with dense zirconia media using distilled water as the milling fluid and a few drops of dispersant for three hours at room temperature.

The resulting slurry was separated from the zirconia media and dried in air in an oven at from about 120° C. to 150° C.

The resulting powdered material had an average particle size which was submicron. It was placed in shallow, high density, high purity alumina ceramic boats to form a low bulk density powder bed roughly 1.0 to 1.5 cm in depth in each boat. Loose fitting alumina lids were placed on the boats.

The material was heated in air at about atmospheric pressure to 750° C. at a rate of 100° C. per hour to protect the alumina boats from thermal shock, then to 925° C. at a rate of 10° C. per hour. It was maintained at 925° C. for 48 hours and then furnace cooled to room temperature. X-ray diffraction analysis of the resultant product showed that the carbonates had completely decomposed to their respective oxides and that these oxides had reacted with themselves and the cupric oxide to form compounds and had also combined to form solid solutions. No appreciable amounts of the individual oxides was detected.

To produce the matrix powder, 117.54 grams of the resulting Ca-Sr-Cu-oxide product, 70.56 grams of bismuth sesquioxide powder and 11.94 grams of lead oxide powder were dry-milled in a polyethylene jar with dense zirconia media for 30 minutes at room temperature. The milled material, i.e. matrix powder, was separated from the media on a coarse Nylon screen.

A predetermined amount of a 0.017 molar solution of uranyl nitrate in methanol was blended with about 25.0 grams of the matrix powder along with sufficient methanol to form a slurry. The slurry was dried in air at low heat below 100° C. The resulting Reaction Mixture B (used to form Sample B) was provided (by the nitrate) with an oxide with dopant atoms equivalent to natural uranium dioxide in an amount of 0.4% by weight of the reaction mixture (800 atomic ppm U).

Reaction Mixture C (used to form Sample C) was produced in substantially the same manner as Reaction Mixture B except that it was provided with the equivalent of natural uranium dioxide in an amount of 0.8% by weight of the reaction mixture (1600 atomic ppm U).

Reaction Mixture A (used to form Sample A) was an undoped control comprised only of the matrix powder.

Each reaction mixture appeared to be comprised of an intimate uniform mixture of the reactants.

About a 3 mm thick substantially uniform layer of each reaction mixture (about 5–7 grams) was placed in a gold foil boat, covered with loose fitting gold foil cover, fired in air at 860° C. for 187 hours, and quenched in air to room temperature.

Each resulting product was comminuted with boron carbide mortar and pestle to deaggregate the material and reduce its crystal size. Substantially equivalent amounts (about 0.22 grams) of the resulting samples (Samples A, B and C) were tamped into small fused quartz tubes using a pressure of about 2 MPa at 23° C. Each tube was closed with a plastic plug and sealed with epoxy.

X-ray diffraction analysis of the Sample A powder showed that it contained the phase $Bi_{1.7}Pb_{0.3}Ca_2Sr_2Cu_3O_{10\pm z}$ in an amount of at least 90% by weight of the powder. From other work, it was known that z in this phase was very nearly equal to zero.

The superconductivity of the Sample A powder was determined by a conventional technique, i.e. the AC Susceptibility Technique. This technique comprised using the powder as an active element in a L-C resonance circuit and measuring the resonance frequency as a function of the circuit's temperature. The transition temperature is that at which there is a larger than background increase in the resonant frequency. The powder was determined to have a zero resistance transition temperature of about 109K.

EXAMPLE 2

A particulate mixture comprised of 100.09 grams of calcium carbonate, 295.26 grams of strontium carbonate and 159.08 grams of cupric oxide was wet milled in a two liter polyethylene jar with 3200 grams of ⅜ inch diameter dense zirconia media using distilled water as the milling fluid and a few drops of dispersant for three hours at room temperature.

The resulting slurry was separated from the zirconia media and dried in air in an oven at from about 120° C. to 150° C.

The resulting powdered material had an average particle size which was submicron. It was placed in shallow, high density, high purity alumina ceramic boats to form a low bulk density powder bed roughly 1.0 to 1.5 cm in depth in each boat. Loose fitting alumina lids were placed on the boats.

The material was heated in air at about atmospheric pressure to 750° C. at a rate of 100° C. per hour to protect the alumina boats from thermal shock, then to 925° C. at a rate of 10° C. per hour. It was maintained at 925° C. for 48 hours and then furnace cooled to room temperature. X-ray diffraction analysis of the resultant product showed that the carbonates had completely decomposed to their respective oxides and that these oxides had reacted with themselves and the cupric oxide to form compounds and had also combined to form solid solutions. No appreciable amounts of the individual oxides was detected.

Two aliquots of the composition comprised of 95.10 grams of the resulting Ca-Sr-Cu-oxide product, 103.85 grams of bismuth sesquioxide and 50 grams of alkali chloride salt were dry-milled in a 500 ml polyethylene jar with 1600 grams of ⅜ inch diameter dense zirconia media for 45 minutes at room temperature. The salt was comprised of NaCl-50 mol % KCl and comprised about 20% by weight of the total amount of oxides and chloride present. The milled material was separated from the media on a Nylon screen.

A predetermined amount of a 0.017 molar solution of uranyl nitrate in methanol was blended with about 25 grams of the milled material along with sufficient methanol to form a slurry. The slurry was dried in air at low heat below 100° C. The resulting Reaction Mixture BB (used to form Sample BB) was provided (by the nitrate) with the equivalent of natural uranium dioxide in an amount of 0.4% by weight of the reaction mixture (880 atomic ppm U).

Reaction Mixture CC (used to form Sample CC) was produced in substantially the same manner as Reaction Mixture BB except that it was provided with the equivalent of natural uranium dioxide in an amount of 0.8% by weight of the reaction mixture (1760 atomic ppm U).

Reaction Mixture AA (used to form Sample AA) was an undoped control comprised only of the matrix powder.

About a 3 mm thick substantially uniform layer of each reaction mixture (about 5–7 grams) was placed in a gold foil boat, covered with loose fitting gold foil cover, fired in air at 850° C. for 41.5 hours, and quenched in air to room temperature.

Each resulting reacted product was in the form of crystalline aggregates intermixed with the solidified alkali chloride solvent. The alkali chloride comprised about 20% by weight of the product.

Each resulting product, i.e. sample, was comminuted with boron carbide mortar and pestle to deaggregate the material and reduce its crystal size.

The superconductivity of Sample AA was determined by the AC Susceptibility Technique disclosed in Example 1. The powder was determined to have a zero resistance transition temperature of about 84K.

X-ray diffraction analysis of the Sample AA powder showed that the crystalline aggregates comprised phase pure $Bi_2CaSr_2Cu_2O_x$. From other work, it was known that x was about 8.

Substantially equivalent amounts (about 0.22 grams) of the resulting samples (Samples AA, BB and CC) were tamped into small fused quartz tubes using a pressure of about 2 MPa at 23° C. Each tube was closed with a plastic plug and sealed with epoxy.

EXAMPLE 3

The samples produced in Examples 1 and 2 were exposed in the sealed quartz tubes to thermal neutrons (ratio of <1 MeV to >1 MeV, 33:1) in the Brookhaven Medical Reactor. The nominal background temperature during irradiation was 60° C.; the highest temperature was less than 100° C. The samples were exposed to a fluence of $1.9 \times 10^{17}$ thermal neutrons per $cm^2$, as was determined by fission track counting in glass dosimeters as disclosed in the article by R. L. Fleischer, P. B. Price, and R. M. Walker, *Nucl. Sci. Eng.* 22, 153 (1965).

Fission fragments for $^{235}U$ have a double-peaked mass and energy distribution with an average of mass of 117 and energy of 84 MeV. The maximum internal concentration of fission events of $1.1 \times 10^{14}/cm^3$ was designed to approach (within a factor of two) that known to have a large effect on the critical current of Y-Ba-Cu-O at 1 to 3 Tesla, as disclosed in the article by R. L. Fleischer, H. R. Hart,Jr., K. W. Lay, and F. E. Luborsky, *Phys. Rev.* B40 (1989) page 2163. The concentration is given by $30 \times 10^{-8} \phi c$, where $\phi$ is the neutron fluence in $cm^{-2}$ and c, the uranium concentration, is in atom fraction/$10^6$. Given that the sum of the ranges of the two fragments from a fission event is 16 $\mu m$, the maximum internal dose may also be thought of as $9 \times 10^{10}$ fission fragments/$cm^2$.

MEASUREMENT OF FLUX PINNING BY MAGNETIC HYSTERESIS

The measurements of the change in bulk flux pinning upon fission-fragment irradiation were carried out. Two potential measures of flux pinning are magnetic hysteresis and transport critical current. For polycrystalline bodies or powder samples, the transport critical-current density is strongly dependent on the usually very poor intergrain coupling. Therefore, magnetic hysteresis was chosen for the measurement. The primary results are presented as magnetic hysteresis (emu/$cm^3$) at a field of 0.8 Tesla measured as a function of temperature (10K to 77K).

In order to measure the magnetic hysteresis loops, a Princeton Applied Research vibrating-sample magnetometer was used with a 3 Tesla electromagnet. The current in the electromagnet was programmed with a triangular wave form in order to generate the magnetization-hysteresis curve; saturation of the iron in the electromagnet resulted in a nonlinear field sweep. The field was measured by a Hall probe placed in the gap of the magnet. An ac signal proportional to the magnetization was detected by pick-up coils arranged to cancel out common-mode noise. The output of the coils was amplified by a lock-in amplifier using a 100 ms filter time constant. The outputs of the Hall probe (field) and lock-in (magnetization) were fed to an x-y recorder. Calibration of the magnetization scale was done by measuring the saturation flux from a disk of pure nickel of known weight. The sample was mounted with the long axis perpendicular to the magnetic field. Demagnetization effects are negligible (<1.5%) for the magnetizations observed at 0.8 Tesla.

A Janis helium cryostat, a Lake Shore temperature controller, and a carbon-glass resistance thermometer were used to control the temperature in the range 10K to 77K. At each temperature, after the temperature was stabilized, the sample was run through one ±2.5 Tesla field cycle before recording the magnetization-hysteresis curve. A constant sweep rate of current corresponding to a 1000 second period was used.

Magnetization-hysteresis curves at 35K were measured for the unirradiated and irradiated samples and are shown in FIGS. 1 and 2.

ΔM in the definition of hysteresis, used in the following discussions is the full difference in magnetization. The data are the average of the ΔM's obtained at 0.8 Tesla and at −0.8 Tesla. In order to determine the sensitivity of the hysteresis to the rate of field sweep, ΔM at 0.8 Tesla was measured for field sweep periods ranging from 20 seconds to 2000 seconds for the samples and temperature shown in FIG. 1. The hysteresis at ±0.8 Tesla was found typically to decrease linearly with the logarithm of the period.

In FIGS. 1 and 3 are the results of hysteresis measurements displayed for irradiated samples containing 0, 800, and 1600 atomic ppm of uranium and for unirradiated 0 and 1600 ppm samples. The irradiation was $1.9 \times 10^{17}$ thermal neutrons/cm$^2$. Strong, temperature-dependent enhancement was observed. The enhancements in flux pinning are shown in FIGS. 2 and 4. They range from 10 times at 25K to 70 times at 50K. Note that magnetic hysteresis is not decreasing at liquid nitrogen temperature.

The temperature dependence of the hysteresis indicates that not only the magnitude of the hysteresis has increased upon radiation; the pinning energy of the fission-fragment-induced pinning centers was larger than that of the pinning centers in the unirradiated samples.

The data are shown in Table I where Fission Fragment Dose can be considered as substantially the equivalent of fission events per cubic centimeter of a sintered body.

TABLE I

| Sample | U-concentration (atom ppm) and Temperature (°K.) | Magnetic Hysteresis at 0.8 Tesla (emu/cc) | | | |
|---|---|---|---|---|---|
| | | \multicolumn{3}{c}{Fission Fragment Dose} | | Neutron Irradiated Only |
| | | 0 | $4.6 \cdot 10^{13}$/cc | $9.3 \cdot 10^{13}$/cc | |
| A | 0 ppm 10 | 48. | — | — | 53. |
| | 35 | 2.0 | — | — | 3.0 |
| | 50 | 0.18 | — | — | 0.28 |
| | 63 | <0.06 | — | — | <0.06 |
| | 77 | <0.06 | — | — | <0.06 |
| B | 800 ppm 10 | — | — | — | — |
| | 35 | — | 15 | — | — |
| | 50 | — | 3.0 | — | — |
| | 63 | — | 0.47 | — | — |
| | 77 | — | 0.04 | — | — |
| C | 1600 ppm 10 | 34. | — | 120 | — |
| | 35 | 0.68 | — | 27 | — |
| | 50 | 0.056 | — | 4.1 | — |
| | 63 | <0.06 | — | 0.42 | — |
| | 77 | <0.06 | — | — | — |
| AA | 0 ppm 10 | 23 | — | — | 26 |
| | 35 | — | — | — | 0.23 |
| | 50 | <0.06 | — | — | <0.06 |
| BB | 880 ppm 10 | 18 | 42 | — | — |
| | 35 | — | 1.9 | — | — |
| | 50 | — | 0.065 | — | — |
| CC | 1760 ppm 10 | 19 | — | 49 | — |
| | 35 | — | — | 3.5 | — |
| | 50 | — | — | 0.058 | — |

Table I shows that the hysteresis for the undoped samples was very little changed by a thermal neutron fluence of $1.9 \times 10^{17}$/cm$^2$. The increases were 4.0%, 1.3%, and 0.8% of those produced in the 1600 ppm-uranium sample (Sample C) at 10K, 35K, and 50K. The hysteresis values for the irradiated U-doped samples were enhanced relative to both the undoped, irradiated samples and the unirradiated doped samples.

Light microscopy and image analysis were used to determine the size and shape distributions of the grains of the powders for the 800 (Sample B) and 1600 ppm (Sample C) U-containing samples. The average ratios of the maximum diameter to the minimum diameter were 20 to 30. The volume weighted average equivalent diameters were 22 μm and 17 μm, respectively, for the $Bi_{2-y}Pb_yCa_2Sr_2Cu_3O_{10}$ and $Bi_2CaSr_2Cu_2O_8$ based materials. In addition, the image analysis was used to determine the effective size and shape of the grains for use in calculating the intragranular critical-current density from the magnetic hysteresis by means of the critical-state model, as described in the next section.

INTERPRETATION OF MAGNETIC HYSTERESIS: INTRAGRANULAR CRITICAL-CURRENT DENSITIES

The critical-state model, as disclosed in the articles by C. P. Bean, *Phys. Rev. Lett.* 8, 250 (1962); C. P. Bean, *Rev. Mbd. Phys.* 36, 31 (1964), together with an appropriate measurement of magnetic hysteresis, allows one to determine, for a homogeneous material, the product of the critical-current density and the dimension of the sample, $J_cD$. Unfortunately, for an inhomogeneous material such as a sintered compact the application of the critical-state model is not straightforward. At one extreme the current may flow as if the sample were homogeneous, yielding $J_{c,s}D_s$, where $D_s$ is the dimension of the sample. At the other extreme, the grains (or even smaller entities) may be essentially isolated as far as supercurrents are concerned; in this case the product obtained is $J_{c,g}D_g$, where $D_g$ is the dimension of the grain. Intermediate situations can occur, in which a portion of the super current flows throughout the sample and another portion is restricted to the grains. The critical-state model does not allow one to determine separately the applicable sizes of the regions and the appropriate $J_c$'s. There is thus an essential ambiguity in the interpretation of magnetic hysteresis by means of the critical-state model.

It is possible in principle to determine the applicable D and thus $J_c$ by a destructive experiment in which the sample is ground to powder and the magnetic hysteresis is followed as the size of the powder is decreased. The magnetic hysteresis remains unchanged as long as the dimension of the sample or powder is greater than the effective D; it decreases with size as the powder is ground into sizes smaller than D. Such experiments, as disclosed in the articles by M. Suenaga, A. Ghosh, T. Asano, R. L. Sabatini, and A. R. Moodenbaugh, *High Temperature Superconductors*, Mater.Res.Soc.Symp.-Proc., Vol. 99, edited by M. B. Brodsky, R. C. Dynes, K. Kitazawa, and H. L. Tuller (Materials Research Society, Pittsburgh, 1988), p. 247; and K. Itoh, H. Wada, T. Kuroda, Y. Kaieda, 0. Odawara, and T. Oie, *Cryogenics* 28, 575 (1988); have shown that for polycrystalline sintered compacts the effective size is not the sample size, but is closer to the (much smaller) grain size. This result is to be expected if the intergrain superconductive coupling is very weak. In the present analysis the assumption is made that, at 0.8 Tesla, the currents are restricted to the grains; the measured, appropriately averaged grain size is used for D and the current densities thus calculated are described as intragranular critical-current densities.

The critical-state model yields particularly simple expressions for the hysteresis for crystals of simple cross-section when certain conditions are met: The applied field is large compared with $H_{cf}$, the field variation across the sample is small enough that $J_c$ varies little across the sample; and the field has been swept through a sufficiently large excursion that critical currents have been induced in the same sense throughout the sample. These conditions are met at 0.8 Tesla in the present experiment.

The contribution of each grain to the magnetic hysteresis was calculated and summed for several hundred grains to give the factor relating the magnetic hysteresis to the critical-current density. Such analyses were performed for Samples B and BB, but not for the undoped samples. For convenience of discussion and presentation the factor obtained can be related to an effective diameter using the expression given above for a circular cross section. The effective diameters are both 25 μm. It should be noted that this effective diameter differs from the volume-weighted values given above; the weighting differs for the magnetic analysis.

The intragranular critical-current densities calculated are shown in FIG. 1 on the right-hand scale. The discussion in the section, Measurement of Flux Pinning By Magnetic Hysteresis, applies to the critical-current densities as well, since the magnetic hysteresis and critical-current densities are related by a constant factor for each sample. Caution must be exercised in considering these current densities, for the use of the dimensions of the grains in the critical-state model is, as mentioned above, an oversimplification of a complex situation. If the dimensions of the pressed powder sample had been used instead of the grain size, the critical-current densities calculated would have been smaller by a factor of 100. The important point is that, whether measured by magnetic hysteresis or by a derived critical-current density, fission-fragment irradiation of Bi-Ca-Sr-Cu-O or Bi-Pb-Ca-Sr-Cu-O leads to a significant enhancement of flux pinning.

One special merit of fission events is a greater localization of damage into clumps of disorder—as opposed to dispersed point defects, such as produced for example by electron or gamma-ray irradiation. Because transmission electron microscopy examination found no tracks, the damage present is not from ionization, but from the 5% of the fission energy that goes directly into atomic collisions.

Even so, the expected damage is more localized than that from other forms of radiation damage.

TABLE II

| Estimated Atomic Displacements per Particle | |
|---|---|
| Particle | Approximate Number of Atomic Displacements |
| 1 MeV electron | 1 |
| 0.0025 eV neutron | 10 |
| 1 MeV neutron | 2,000 |
| 1 pair fission fragments (170 MeV) | 200,000 |

Table II indicates the relative damage effectiveness of fission fragments under the assumption that each 50 eV expended in atomic collisions can on the average displace an atom. In addition, the fission damage is localized to within <10 μm of the fissionable atom, whereas the mean free path for a 1 MeV neutron in $Bi_{1.7}Pb_{0.3}Ca_2Sr_2Cr_3O_{10}$ is about 3 cm and its energy will be lost through a series of collisions, not in a single event.

The large effects seen here are clearly caused by fission and not primarily by the neutron irradiation. The magnitudes of the neutron effects are shown by the 0 ppm U samples to be small. Thermal neutrons, via capture and gamma-ray emission can produce displacements as disclosed in the article by R. M. Walker, *J. Nucl. Mat.* 2, 147 (1960).

In this case, the number is uncertain, but not necessarily small, relative to fission damage, but it is more uniformly dispersed.

What is claimed is:

1. A sinterable polycrystalline doped superconductive oxide powder having a maximum particle size of about 40 microns comprising a superconductive oxide selected from the group consisting of $Bi_2CaSr_2Cu_2O_{8\pm x}$ and $Bi_{2-y}Pb_yCa_2Sr_2Cu_3O_{10\pm z}$ in which x is from zero to 0.5, y is from 0.1 to 0.5, and z is from zero to less than 1, and sufficient fissionable atoms selected from the group consisting of uranium-235 and plutonium-239 to produce from about $0.25 \times 10^{14}$ to about $5 \times 10^{14}$ fission events per cubic centimeter upon irradiation by thermal neutrons.

2. A process for producing a doped superconductive body having improved critical current capacity for irradiation by thermal neutrons which comprises:
   (a) forming an admixture comprising a fissionable material selected from the group consisting of uranium-235 and plutonium-239 and a superconductive material selected from the group consisting of $Bi_2CaSr_2Cu_2O_{8\pm x}$ and $Bi_{2-y}Pb_yCa_2Sr_2Cu_3O_{10\pm z}$ in which x is from 0 to 0.5, y is from 0.1 to 0.5 and z is from 0 to less than 1;
   (b) firing the admixture in an oxidizing atmosphere at a temperature from about 820° C. to about 870° C. to produce a reaction product;
   (c) cooling the reaction product in an oxidizing atmosphere;
   (d) comminuting the reaction to form a sinterable powder having a maximum particle size of about 40 microns in the longest direction;
   (e) sintering the powder to form a superconductive body.

3. The process of claim 2 wherein the superconductive material has the nominal formula $Bi_2CaSr_2Cu_2O_{8\pm z}$.

4. The process of claim 2 wherein the superconductive material has the nominal formula $Bi_{2-y}Pb_yCa_2Sr_2Cu_3O_{10\pm z}$.

* * * * *